US008088434B2

(12) United States Patent
Nicholas

(10) Patent No.: US 8,088,434 B2
(45) Date of Patent: Jan. 3, 2012

(54) TEMPLATED GROWTH OF GRAPHENIC MATERIALS

(75) Inventor: Nolan Nicholas, Houston, TX (US)

(73) Assignee: CXnanophysics, LLC, South Charleston, WV (US)

( * ) Notice: Subject to any disclaimer, the term of this patent is extended or adjusted under 35 U.S.C. 154(b) by 825 days.

(21) Appl. No.: 12/135,914

(22) Filed: Jun. 9, 2008

(65) Prior Publication Data
US 2009/0087543 A1 Apr. 2, 2009

Related U.S. Application Data

(60) Provisional application No. 60/943,041, filed on Jun. 9, 2007.

(51) Int. Cl.
*C23C 14/54* (2006.01)
*C23C 16/00* (2006.01)
(52) U.S. Cl. ..................... 427/10; 427/248.1; 427/249.1
(58) Field of Classification Search .................... 427/10, 427/248.1, 249.1
See application file for complete search history.

(56) References Cited

U.S. PATENT DOCUMENTS

| 3,031,413 | A | 4/1962 | Barber et al. | |
|---|---|---|---|---|
| 3,700,568 | A | 10/1972 | Fuhrman | |
| 7,332,222 | B2 | 2/2008 | Luzzi | |
| 2003/0148086 | A1 | 8/2003 | Pfefferle | |
| 2004/0247516 | A1 | 12/2004 | Pfefferle | |
| 2006/0231381 | A1 | 10/2006 | Jensen | |
| 2008/0061477 | A1* | 3/2008 | Capizzo | ............ 264/402 |

OTHER PUBLICATIONS

Jensen et al. Current-controlled nanotube growth and zone refinement, 2005, App. Phys. Lett., 86, 173107.*
Y.C. Sui et al, "Structure, Thermal Stability, and Deformation of Multibranched Carbon Nanotubes Synthesized by CVDin the AAO Template," J. Phys. Chem. B 2001, 105, pp. 1523-1527.
Nolan Nicholas, "Templated growth of graphene: A novel method for efficient graphene synthesis," Master's Thesis, Rice University, Houston, Texas, 2006.
K. Jensen et al, "Current controlled nanotube growth and zone refinement," Appl. Phys. Lett., 2005: 86, p. 173107.
J. Cumings et al, "Low Friction Nanoscale Linear Bearing Realized from Multiwall Carbon Nanotubes," Science, 2000: 289, pp. 602-604.
K. Jensen et al, "Tunable Nanoresonators Constructed from Telescoping Nanotubes," Phys. Rev. Lett. 2006:96, p. 215503.
T.D. Yuzvinsky et al, "Controlled placement of highly aligned carbon nanotubes for the manufacture of arrays of nanoscale torsional actuators," Nanotechnology, 2006:17, pp. 434-438.

(Continued)

*Primary Examiner* — Kelly M Gambetta
(74) *Attorney, Agent, or Firm* — Winstead PC

(57) ABSTRACT

A method is disclosed for producing graphenic materials by templated growth along a preformed graphenic material lattice edge, wherein at least one of the graphenic material or template is translated during growth of the graphenic material. A method for preparing CNTs from preformed CNT substrates in the presence of cylindrical templating structures and a reactive carbon source in a fluid phase is also disclosed, wherein at least one of the CNT substrate or the cylindrical templating structure is translated during addition of carbon atoms to the CNT substrate. A method is also disclosed for preparing CNTs from preformed CNT substrates in the presence of cylindrical templating structures and a carbon source in a fluid phase, wherein non-thermalized excited states are produced on the CNT substrate and at least one of the CNT substrate or the cylindrical templating structure is translated during addition of carbon atoms to the CNT substrate.

21 Claims, 6 Drawing Sheets

OTHER PUBLICATIONS

S.B. Lee et al, "Fabrication of multiwalled carbon nanotube bridges by polymethylmethacrylate suspended dispersion," J. Vac. Sci. Technol. B, 2003:21(3), pp. 996-999.

P.G. Collins et al, "Engineering Carbon Nanotubes and Nanotube Circuits Using Electrical Breakdown," Science, 2001:292, pp. 706-709.

T. Rueckes et al, "Carbon Nanotube Based Nonvolatile Random Access Memory for Molecular Computing," Science, 2000:289, pp. 94-97.

C. Li et al, "Fabrication approach for molecular memory arrays," Appl. Phys. Lett. 2003:82, pp. 645-647.

T.D. Yuzvinsky et al, "Precision cutting of nanotubes with a low energy electron beam," Appl. Phys. Lett. 2005:86, pp. 053109.

Y.H. Lee et al, "Catalytic Growth of Single-Wall Carbon Nanotubes: An Ab Initio Study," Phys. Rev. Lett., 1997:78, pp. 2393-2396.

E.C. Walter, et al, "Noble and Coinage Metal Nanowires by Electrochemical Step Edge Decoration," J. Phys. Chem. B, 2002:106, pp. 11407-11411.

S.B. Austerman, "Growth of Graphite Crystals from Solution," in Chemistry and Physics of Carbon, vol. 4, P.L.Walker, ed., 1968, Marcel Dekker: New York, pp. 137-183.

The Metallurgy of Cast Iron: Proceedings of the 2nd International Symposium on the Metallurgy of Cast Iron, Lux, Minkoff, Mollard, eds., Georgi Publishing Co.: St. Saphorin, Switzerland.

S. Liu et al, "The Formation of Kish Graphite," Carbon, 1991:29, pp. 547-555.

H.T. Angus, Cast Iron: Physical and Engineering Properties, 1976, Butterworths: Boston, MA.

Crystal Growth, 2nd edition, B.R. Pamplin, ed., Pergamon Press, pp. 44-51.

J. Brillo et al, "Surface Tension of Nickel, Copper, Iron and their Binary Alloys," in Proceedings of the IV International Conference-High Temperature Capillarity, J. Mat. Sci., 2005_40, pp. 2213-2216.

R.H. McSwain et al, The Metallurgy of Cast Iron: Proceedings of the 2nd International Symposium on the Metallurgy of Cast Iron, Lux, Minkoff, Mollard, eds., Beorgi Publishing Co.: St. Saphorin, Switzerland, pp. 423-442.

S.B. Austerman et al, "Graphite Crystal Growth", DOE Report #NAA-SR-12486, Jan. 1, 1968.

C. Roscoe et al, "Growth of Graphite Single Crystals from Iron Carbon Solutions", J. Mat. Sci., 1971:6, pp. 998-1006.

S.B. Austerman et al, "Growth and Characterization of Graphite Single Crystals," Carbon, 1967:5, pp. 549-557.

P. Goethel et al, "Mechanism of Graphite Hydrogenation Catalyzed by Nickel," J. Catalysis, 1987:108, pp. 356-363.

A. Tomita et al, "An Optical Microscopic Study on the Catalytic Hydrogenation of Graphite," J. Phys. Chem. 1974:78, pp. 2254-2258.

C.W. Keep et al, "Studies of the Nickel Catalyzed Hydrogenation of Graphite," J. Catalysis, 1980:66, pp. 451-462.

K. Nakada et al, "Edge State in graphene ribbons: Nanometer size effect and edge shape dependence," Phys. Rev. B, 1996:54(24), pp. 17954-17961.

T. Yamamoto et al, "Edge state signature in optical absorption of nanographenes: tight binding method and time dependent density functional theory calculations," Phys. Rev. B, 2006:74, p. 121409.

L. Radovic et al, "On the Chemical Nature of Graphene Edges: original of Stability and Potential for Magnetism in carbon materials," J. Am. Chem. Soc., 2005:127, pp. 5917-5927.

S. Ozeki et al, "Scanning Tunneling Microscopy of UV Induced Gasification Reaction on Highly Ordered Pyrolytic Graphite," Jpn. J. Appl. Phys., 1996:35, pp. 3772-3774.

L. Kavan, "Electrochemical Carbon," Chem. Rev., 1997:97, pp. 3061-3082.

S. Shiraishi et al, "A Trial of Electrochemical Synthesis of Carbon from Acetylene in Nonaqueous Electrolytes," in ACS OMNIBOOKSONLINE, 1999, pp. 104-105.

A.K. Pal et al, "Electrodeposited carbon nanotube thin films," Thin Solid Films, 2005:476, pp. 284-294.

P.S. Ho et al, "Electomigration in Metals," Rep. Prog. Phys. 1989:52, pp. 301-348.

K.G. Libbrecht et al, "Electrically Induced Morphological Instabilities in Free Dendrite Growth," Phys. Rev. Lett, 1998:81, pp. 176-179.

Zhang et al, "Coaxial nanocable: carbon nanotube core sheathed with boron nitride nanotube," Appl. Phys. Lett, 2007:90, p. 133103.

W. Barber et al, "Solubility of Calcium Carbide in Fused Salt Systems," J. Phys. Chem., 1961:65: pp. 2026-2028.

J.B. Bai et al, "Synthesis of SWNTs and MWNTs by a molten salt (NaCL) method," Chem. Phys. Lett., 2002:365, pp. 184-188.

N.I. Alekseev et al, "On the Mechanism of Carbon Nanotube Formation in Electrochemical Processes," Technical Physics, 2006:51, pp. 349-355.

Handbook of Ternary Alloy Phase Diagrams, vol. 5, P. Villar, A. Prince, H. Okumoto, editors, 1995, ASM International, Materials Park, OH.

G.Z. Chen et al, "Recent Development in Electrolytic Formation of Carbon Nanotubes in Molten Salts," J. Mining and Metallurgy, 2003:39 B, pp. 309-342.

G.Z. Chen et al, "Electrolytic conversion of graphite to carbon nanotubes in fused salts," J. Electroanalytical Chem., 1998:446, pp. 1-6.

J.F. Maillot et al, "Phae Relationships in the Calcium Chloride-Calcium Carbide System," Can. J. Chem., 1972:50, pp. 839-843.

N.I. Alekseev et al, "On the Mechanism of Carbon Nanotube Formation i Electrochemical Processes," Technical Physics, 2006:51(3), pp. 349-355.

S.H. Hur et al, "Extreme bendability of single walled carbon nanotube networks transferred from high temperature growth substrates to plastic and their use in thin film transistors," Appl. Phys. Lett. 2005:86, p. 243502.

S.J. Kang et al, "Printed Multilayer Superstructures of Aligned Single Walled Carbon Nanotubes for Electronic Applications," Nano Letters, 2007:7(11), pp. 3433-3438.

S.J. Kang et al, "High performance electronics using dense, perfectly aligned arrays of single walled carbon nanotubes," Nature Nanotechnology, 2007:2, pp. 230-236 and Supplementary Information.

X.M.H. Huang et al, "Controlled Placement of Individual Carbon Nanotubes," Nano Lett. 2005:5(7), pp. 151-158.

K. Bradley et al, "Flexible Nanotube Electronics," 2003:3(10), pp. 1353-1355.

S. Bandow et al, "Turning Peapods into Double Walled Carbon Nanotubes," Mat. Res. Soc. Bull. Apr. 2004, pp. 260-264.

B.W. Smith et al, "Formation Mechanism of Fullerene peapods and coaxial tubes: a path to large scale synthesis," Chem. Phys. Lett., 2000:321, pp. 169-174.

H. Su et al, "Simulations on the effects of confinement and Ni-catalysis on the formation of tubular fullerene structures from peapod precursors," Phys. Rev. B, 2007:75, p. 134107.

W. Mickelson et al, "Packing C60 in Boron Nitride Nanotubes," Science, 2003:300, pp. 467-469.

I.V. Krive et al, "Carbon 'peapods'—a new tunable nanoscale graphitic structure (reviwew)," Low Temp. Phys. 2006:32 (10), pp. 887-905.

S. Bandow et al, "Raman scattering study of double wall carbon nanotubes derived from the chains of fullerenes in single wall carbon nanotubes," Chem. Phys. Lett. 2001:337, pp. 48-54.

* cited by examiner

TEMPLATED GROWTH OF GRAPHENIC MATERIALS

CROSS-REFERENCE TO RELATED APPLICATIONS

This application claims priority to U.S. provisional application 60/943,041, filed Jun. 9, 2007, which is hereby incorporated by reference as if written herein in its entirety.

BACKGROUND

Carbon nanotubes (CNTs) are an allotrope of carbon having an exceedingly long length-to-diameter ratio. These cylindrical carbon molecules possess novel properties, including exceptional strength and unique electrical properties, making them of substantial interest for applications in diverse fields of nanotechnology, electronic devices, optical devices and materials science. Inorganic nanotubes are also known. Efficient methods for production of CNTs is therefore an area of intense research.

A number of techniques are available for synthesizing CNTs. Many methods for synthesizing CNTs produce mixtures of multi-walled carbon nanotubes (MWCNTs) and SWCNTs. For CNTs to be optimally utilized, methods for efficient production of SWCNTs having controlled properties, such as length, diameter, chirality, and number of walls are desired. Further, efficient methods are desired to manipulate synthesized CNTs into multi-nanotube arrays with controlled placement of the CNTs, which may be used in electronic, optical and mechanical applications, such as electronic devices.

SUMMARY

In the most general sense, the embodiments disclosed herein relate to a method for producing a structured material through a process comprised by 1) placing a preformed graphenic material substrate into contact with a templating structure, 2) providing a reactive source of atoms from a fluid phase, 3) depositing atoms from the fluid phase to the preformed substrate and 4) translating at least one of the preformed substrate and the templating structure during the depositing, while maintaining the contact, so as to grow the preformed substrate in to the structured material.

In one aspect, the embodiments disclosed herein relate to a method for producing a CNT, through a process comprised by 1) placing a preformed CNT substrate open on at least one end into proximity of a cylindrical templating structure, such that the CNT substrate contacts the templating structure and aligns with the templating structure in a coaxial fashion within thermal variation, 2) binding a CNT substrate and templating structure to separate inert supports capable of independent translation, 3) providing a reactive carbon source in a fluid phase, and 4) depositing carbon from the fluid phase to the open end of a CNT substrate, wherein at least one of the CNT substrate or templating structure is translated during the depositing.

In another aspect, the embodiments disclosed herein relate to a method for producing a CNT, through a process comprised by 1) placing a preformed CNT substrate open on at least one end into proximity of a cylindrical templating structure, such that the CNT substrate contacts the templating structure and aligns with the templating structure in a coaxial fashion within thermal variation, 2) binding a CNT substrate and templating structure to separate inert supports capable of independent translation, 3) producing non-thermalized excited states in a CNT substrate lattice edge, and 4) depositing carbon from a fluid phase to the open end of a CNT substrate, wherein at least one of the CNT substrate or templating structure is translated during addition of carbon to the CNT substrate.

The foregoing has outlined rather broadly the features of the present disclosure in order that the detailed description that follows may be better understood. Additional features and advantages will be described hereinafter which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings, in which.

DETAILED DESCRIPTION

Figure 1:
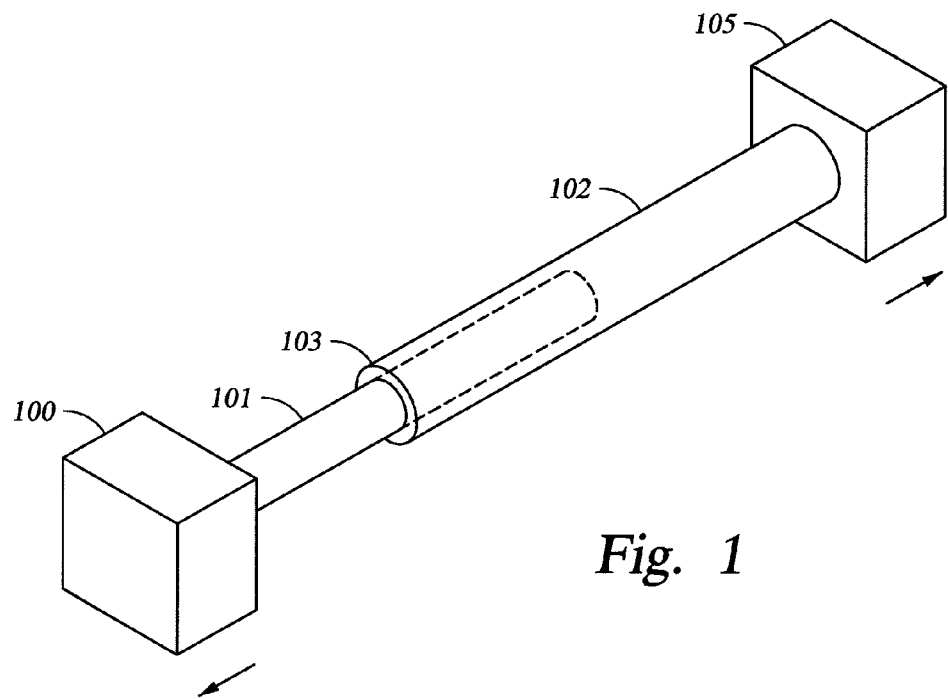
FIG. 1 shows an embodiment of the co-axial arrangement of an inert templating structure and CNT substrate in the present disclosure.

In the following description, certain details are set forth, such as specific quantities and sizes, to provide a thorough understanding of embodiments disclosed herein. However, it will be understood by those skilled in the art that the present disclosure may be practiced without such specific limitations. In many cases, details concerning such considerations and the like have been omitted inasmuch as such details are not necessary to obtain a complete understanding of the present disclosure and are within the skills of persons of ordinary skill in the relevant art.

The present disclosure generally relates to a method for providing templated growth of structured materials, which may include a graphenic material. The templated growth may be along pre-existing graphenic material lattice edges under influence of a templating structure. Graphenic materials are formed from one or more graphene sheets and demonstrate comparable chemical reactivity to graphene. Graphenic material lattices may include both substitutional and interstitial atoms. In the present disclosure, a preformed graphenic substrate and a templating structure are brought into proximity of one another, such that the preformed graphenic substrate and templating structure are in contact. The contact may be a reduced energy contact, wherein the contacted system is reduced in energy compared to the two separated bodies. A reactive source of atoms is provided in a fluid phase, and atoms are deposited to the graphenic substrate from the fluid phase under influence of the templating structure, while at least one of the preformed graphenic substrate and templating structure is translated during the depositing. Deposition may occur at a lattice edge of the substrate. The reactive source of reactive atoms may be provided as either a monoatomic or polyatomic chemical species. Translation is embodied as either a linear motion or a spooling motion where the graphenic material is wound on to a spool as it is grown. The method may also be practiced wherein more than one preformed graphenic substrate and a single templating structure per preformed graphenic substrate are used to simultaneously grow more than one new graphenic material. One skilled in the art will recognize that graphene, graphenic materials, CNTs, and like structures possess similar chemical reactivity, and the methods of the present disclosure may be used interchangeably for templated growth on these entities through minimal modifications of the disclosure provided herein. Generation of reactive atoms in the fluid phase may be accomplished herein by several different methods, the advantages of which for a given application will be easily recognizable to those of skill in the art.

When the templated growth of graphenic materials is practiced as described herein, a number of advantages are realized for the production of graphenic materials, CNTs, and related structured materials. CNTs produced by this method may be SWCNTs or MWCNTs. DWCNTs are exemplary of MWCNTs. Templated growth accomplishes production of graphenic materials on a pre-existing substrate, wherein van der Waals and Pauli interactions between the template structure and the graphenic substrate define the topology of the graphenic material produced. In particular, production of CNTs under templated growth conditions allows CNTs to be produced that are free of lattice defects and maintain the chirality of the template CNT. Another advantage of the present method is that if either the templating structure, graphenic substrate, or both are translated during addition of atoms to the graphenic substrate, graphenic materials of arbitrary length may be produced from a fixed length templating structure, provided that the graphenic substrate maintains contact with the templating structure. The disclosure herein describes a method to produce CNTs of arbitrary length from a fixed length templating structure. The CNTs produced as described herein have their positions defined at two fixed points, such that the CNTs may be advantageously handled with high precision through mechanical manipulation methods known to those having skill in the art. The methods described herein may be readily conducted in parallel to provide two- and three-dimensional arrays composed of multiple CNTs.

While most of the terms used herein will be recognizable to those having skill in the art, the following definitions are nevertheless put forth to aid in the understanding of the present disclosure. It should be understood, however, that when not explicitly defined, terms should be interpreted as adopting a meaning presently accepted by those of skill in the art.

"Graphene," as defined herein, is a single sheet of carbon atoms covalently bonded in a two-dimensional hexagonal lattice. A graphene sheet may be viewed as a crystal basal plane bounded by termination of the crystal at a lattice edge.

"Graphite," as defined herein, is an ordered collection of graphene sheets stacked on top of one another to form a crystalline structure with van der Waals forces interacting between the graphene sheets and covalent bonding forces interacting within the graphene sheets. Although this definition is true for perfect crystals, in reality graphite has a small percentage of covalent linkages between the graphene sheets.

"Template or templating structure," as defined herein, is an entity that determines the geometry of produced graphenic materials by providing a reduced energy pathway for growth of said graphenic materials. The interaction of the graphenic lattice and template is such that no persistent covalent bonding is produced between the two. Such interaction is achieved through non-covalent forces, including, but not limited to, van der Waals and Pauli interactions.

"Reduced energy contact," as defined herein is the condition wherein non-covalent forces, including, but not limited to, van der Waals and Pauli exclusion forces, lead to a local potential minima as two bodies are brought to an interatomic distance wherein the potential energy between them is near this minima. In the reduced energy contact, the contacted system is reduced in energy compared to the energy of the two separated bodies. The interatomic distance of the reduced energy contact is defined with respect to a spacing between nuclei.

"Array," as defined herein is a two-dimensional or three-dimensional arrangement of graphenic material structures.

"Pirhana," as defined herein is a mixture of sulfuric acid and hydrogen peroxide.

The graphenic materials in the present disclosure may constitute graphene, multiple layers of graphene, all-carbon graphenic materials, non-carbon graphenic materials, and graphenic materials having both carbon and non-carbon atoms. Graphenic materials are particularly embodied in one instance by CNTs. Graphenic materials may be utilized to form graphenic substrates suitable for templated growth. Graphenic materials may be composed of hexagonal lattices of carbon. Graphenic materials are illustrative of substrates herein. It will be understood that other substrate materials which form hexagonal lattices, such as two-dimensional boron nitride are contemplated. Further, materials which form hexagonal lattices mixed with another geometric shape (e.g a triangular lattice), such as elemental boron, are contemplated. One skilled in the art will recognize that simple modifications of the methods described herein may be utilized to template non-carbon atoms on to all-carbon graphenic substrates or carbon atoms on to non-carbon graphenic substrates.

The templating structures in the present disclosure provide a reduced energy pathway for growth of graphenic materials having controlled geometrical properties on to a pre-existing graphenic substrate. The attractive interaction of the graphenic substrate to the templating structure does not produce persistent covalent bonding between the two. Intimate physical contact between the graphenic substrate and the templating structure ensures efficient transfer of structural features from the templating structure to the newly produced graphenic material lattice edge, thus eliminating lattice edge defects and providing the same chirality to the lattice edge as embodied in the templating structure. The lack of covalent bonding between the templating structure and graphenic substrate allows a wide variety of graphenic materials having known geometry to be produced through simple modifications of the disclosure provided herein.

Atoms are added to the graphenic substrate/template structural interface from a fluid phase, which provides a source of reactive carbon or like atoms which form graphenic lattices. One skilled in the art will recognize that the exact chemical mechanism whereby addition of atoms, in particular carbon atoms, to the graphenic substrate occurs may differ depending on the chosen fluid phase atom source. The fluid phase may be a gaseous phase, such as a vapor phase. The vapor phase entity from which the reactive atom species arises may be a solid, liquid, or gas in its standard state at room temperature. The suitability of a particular vapor phase reactive atom source toward a given application will depend on conditions specific to the application and be evident to one having skill in the art. The choice of a particular reactive atom source for a given application should not be considered limiting when other reactive atom sources may be utilized within the spirit and scope of the disclosure.

The fluid phase may be a carbon-containing gas, wherein carbon atoms are deposited on to the graphenic substrate by chemical vapor deposition (CVD). One skilled in the art will recognize that the gas phase carbon-containing compounds may derive from gases, liquids, or solids having high vapor pressures, wherein the reactive carbon atom source is generated from these gas phase compounds by known methods. Suitable carbon-containing compounds for generating a gas phase carbon atom source may include, but are not limited to, at least one member of the group consisting of methane, ethane, propane, butane, isobutane, ethylene, propene, 1-butene, cis-2-butene, trans-2-butene, isobutylene, acetylene, propyne, 1-butyne, 2-butyne, benzene, toluene, carbon monoxide, methanol, ethanol, 1-propanol, 2-propanol, 1-butanol, 2-butanol, 2-methyl-2-propanol, cyclopropane, cyclobutane, acetonitrile, propionitrile, butyronitrile, acetone, butanone, formaldehyde, acetaldehyde, propionaldehyde, and butyraldehyde.

The gas phase carbon atom source may be a molecule in an excited state, wherein increased reactivity with the graphenic substrate may be achieved. When the vapor phase contains an excited state species, the collision rate of the excited state species in the vapor phase may be selected to be sufficiently low so as to avoid generation of unwanted reactive species from non-excited state vapor phase molecules. In some embodiments, the excited state is a vibrational excited state. In other embodiments, the excited state is a radical state. Suitable radical states may include, but are not limited to, $C_2H$ and $C_2H_3$. In still more embodiments, the excited state is an excited electronic state. A representative excited electronic state is non-dissociatively excited acetylene, which has been excited by electromagnetic radiation having a wavelength of about 220 nm, although other excited electronic states can also be utilized within the spirit and scope of the disclosure. The foregoing list of excited state species is meant to be representative of excited state entities suitable for bringing the disclosure to practice and should not be considered limiting for this purpose. One skilled in the art will recognize that an energetically excited state species having suitable reactivity for a given application may be generated by a number of techniques and utilized equivalently in the spirit and scope of the methods described herein.

The fluid phase may also be a carbon-containing liquid. Suitable carbon-containing liquids include, but are not limited to, at least one member of the group consisting of benzene, toluene, xylenes, and like liquids having high carbon content.

The fluid phase may also be a molten metal containing a dissolved carbon source, wherein the molten metal pool is in physical contact with the graphenic substrate. The molten metal source is selected from at least one metal known to provide significant solvation for carbon. Said metals may be chosen from periodic table groups 1-12, the lanthanide elements, and alloys thereof. In certain embodiments, suitable metals include, but are not limited to, at least one member of the group consisting of Fe, Co, Ni, Au, and alloys thereof. Non-metallic elements including, but not limited to Si and P, may optionally be included in the melt to modify the effective carbon saturation (reactivity) and deposition potential. Sulfur and copper are particularly known to decrease the surface energy of carbon-containing molten metal melts, and these elements may also optionally be included. One skilled in the art will recognize that choice of a particular metal solvent system for a given application will be governed by a number of factors, including, but not limited to, melting point, equilibrium solubility of carbon in the molten metal, and reactivity of the carbon species in the chosen molten metal solvent. In a molten metal bath, direct solvation of carbon allows growth of graphenic materials to take place as a quasi-equilibrium thermodynamic crystal growth process controlled by melt supersaturation. The level of supersaturation determines the growth mode from solution in accordance with the Gibbs free energy of carbon in solution versus carbon bound in a lattice. By maintaining the carbon level in the molten metal solvent at slightly supersaturated conditions, growth of graphenic materials from solution is driven to pre-existing graphenic material lattice edge sites.

The dissolved carbon source in the molten metal bath may be introduced from a vapor phase carbon species in certain instances. One skilled in the art will recognize that the vapor phase carbon-containing species may derive from gases, liquids, or solids having low vapor pressures. Said carbon-containing compounds may contain at least one additional element besides carbon, which may include, but not be limited to, the group consisting of hydrogen, oxygen, sulfur, nitrogen, fluorine, chlorine, bromine, iodine, silicon and phosphorus. It is well known in the art of carbon-containing molten metal solutions that the presence of other atoms in solution may affect the carbon activity and growth mode of carbon deposition. For example, other elements may reduce the surface tension of the molten metal bath and lower the interfacial energy between the metal melt and non-wetting surfaces it contacts. Sulfur and copper are particularly known to decrease the surface energy of carbon-containing molten metal melts, and these elements may optionally be included in the molten metal baths described herein. Non-metallic elements including, but not limited to Si and P, may optionally be included in the melt to modify the effective carbon saturation (reactivity) and deposition potential. Suitable carbon-containing compounds for generating a vapor phase carbon source may include, but are not limited to, at least one member of the group consisting of methane, ethane, propane, butane, isobutane, ethylene, propene, 1-butene, cis-2-butene, trans-2-butene, isobutylene, acetylene, propyne, 1-butyne, 2-butyne, benzene, toluene, carbon monoxide, methanol, ethanol, 1-propanol, 2-propanol, 1-butanol, 2-butanol, 2-methyl-2-propanol, cyclopropane, cyclobutane, acetonitrile, propionitrile, butyronitrile, acetone, butanone, formaldehyde, acetaldehyde, propionaldehyde, and butyraldehyde.

The vapor phase may optionally contain an inert diluent gas in addition to the carbon-containing source, such that the molten metal bath is exposed concurrently to both the gas phase carbon-containing compound and inert diluent gas. Suitable diluent gases may include, but are not limited to, at least one component selected from the group consisting of helium, argon, and nitrogen. The vapor phase may optionally contain an etchant component in addition to the carbon-containing source, such that the molten metal bath is exposed concurrently to both the gas phase carbon-containing compound and etchant vapor. In certain cases, it is desirable that the vapor phase contain both the etchant component and diluent gas along with the carbon-containing compound, such that the molten metal bath is concurrently exposed to all three substances. Suitable etchants include, but are not limited to, at least one component selected from the group consisting of water, carbon dioxide, ammonia, and hydrogen.

In certain embodiments, the carbon source in the molten metal bath may be a solid carbon source in direct contact with the bath. Such a carbon source may be dissolved preferentially over the carbon substrate. Preferential dissolution of the carbon source may be achieved through various techniques, such as through applied electrical potentials or by constructing the solid carbon source from a less energetically stable carbon form, such as amorphous carbon.

In certain embodiments, one or more graphenic materials may be grown concurrently from individual, isolated carbon-containing molten metal baths.

One or more metal atoms may be attached to the graphenic material lattice edge in certain embodiments. In high temperature gas phase growth of CNTs, some metal atoms are known to function as effective catalyst species for promoting CNT growth. Bonding of at least one catalytic metal atom to the graphenic material lattice edge may likewise enhance chemical reactivity of the graphenic substrate toward templated growth along the graphenic material lattice edge. Suitable metal atoms may include, but are not limited to, at least one member of periodic table groups 3-12, the lanthanide elements, and combinations thereof. The catalytic metal atoms may be bound to the graphenic material lattice edge through methods resulting in a controlled number and density of metal atoms on the lattice edge.

In some embodiments, catalytic metal atoms are introduced to the graphenic material lattice edge by coupling reactions between mixtures of metal atom bearing species and non-metal bearing species having comparable reactivity toward reactive groups on the graphenic material lattice edge. The density of metal atom incorporation on the graphenic substrate may be controlled simply by adjusting the ratio of metal-bearing to non-metal bearing species in the coupling reaction. Suitable metal atom bearing species may include, but are not limited to, functionalized metallocenes (eg., ferrocene), metal-EDTA derivatives, and related organometallic and metal-ligand complexes. Non-metal bearing species having comparable reactivity to these specific examples may include the functionalized non-metallated ligand or similar compound having comparable reactivity toward the reactive groups on the graphenic material lattice edge. One skilled in the art will recognize that a wide variety of non-metallated compounds having like reactive functionality to the functionalized metal bearing compound may be used to control the density of metal atom deposition. These competing non-metallated species may bear no structural resemblance to the metallated species in certain instances, while still maintaining comparable chemical reactivity to the parent metal bearing compound. A convenient functional group for attaching the metal bearing species and their non-metal bearing counterparts to graphenic material lattice edges is a carboxylic acid, although other functional groups may be manipulated to couple with graphenic material lattice edges through methods known to those skilled in the art. In the instance where the reactive functional group on the metal-bearing compound is a carboxylic acid, the metal bearing species may be attached to surface graphenic material lattice edge OH groups via an esterification reaction through various coupling reaction methodologies known to those skilled in the art. The range of reactions utilized to couple to the graphenic material lattice edge is not limited to esterification, and other coupling strategies including, but not limited to, alkoxylation and amidation are viable alternatives for linking metal atoms to the graphenic material lattice edge.

Ligand binding sites on the graphenic material lattice edge may be reacted with metal ion solutions having variable concentration and pH. The ligand binding sites may be pre-existing in certain embodiments, including, but not limited to, terminal carboxylic acid moieties at the graphenic material lattice edge. A suitable ligand may also be synthesized on the graphenic material lattice edge. One skilled in the art will recognize that certain metal ion solutions will require pH and reaction temperatures having values within a defined range to efficiently bind to the surface ligands. Furthermore, for a given metal salt, a finite attainable concentration range and chemical compatibility profile will be realized due to the innate physical properties of the metal salt.

An aspect of the present disclosure is the translation of at least one of the graphenic substrate or templating structure during addition of carbon or like graphenic atoms to the graphenic substrate. As practiced herein, the graphenic substrate and templating structure are bound to inert supports, which are capable of independent motion and utilized to translate the graphenic substrate, templating structure, or both, wherein the translation is coplanar to the growth of the graphenic substrate. In certain embodiments, the direction of translation is anti-parallel to the direction of graphenic substrate growth. In some embodiments, the support to which the graphenic substrate is bound is independently translated. In other embodiments, the support to which the templating structure is bound is independently translated. In still further embodiments, both supports are translated concurrently. When both supports are translated concurrently, the supports may be translated either toward one another or away from one another. In some embodiments, the supports are concurrently translated in opposite directions. In other embodiments, the supports are concurrently translated in the same direction. The supports may be moved linearly or rotated in a spooling motion to affect translation of the graphenic substrate and templating structure. As a consequence of the translation capability, graphenic materials produced through templated growth on the graphenic substrate are permitted to remain in contact with the templating structure during addition of atoms to the graphenic substrate, while not damaging the graphenic material during the translation process due to minimal sliding friction between the two structures. This arrangement beneficially allows templating structures of finite physical dimension to direct the growth of graphenic materials to an arbitrary length. In certain embodiments wherein the templating structure, graphenic substrate, or both the templating structure and graphenic substrate are translated, the rate of translation is matched by the rate of addition of atoms to the graphenic substrate. If during addition of atoms to the graphenic substrate, the rate at which the templating structure and graphenic substrate are translated apart is too slow, then growth of the graphenic substrate will eventually contact the inert support to which the templating structure is bound. Likewise, if during addition of atoms to the graphenic substrate, the rate at which the templating structure and graphenic substrate are translated apart is too rapid, then growth of the graphenic material will not keep pace with the rate of translation, and the graphenic substrate will eventually become disconnected from the templating structure. In the embodiment of translation described herein, the direction of translation is parallel and coplanar to the plane of growth of the graphenic material. In certain embodiments, the direction of translation is anti-parallel to the direction of graphenic substrate growth. In still further embodiments, translation of the graphenic substrate, templating structure, or both the graphenic substrate and templating structure is accomplished through a winding motion, wherein the graphenic material is wound on to a spool mechanism as it is grown. In certain embodiments, the spool mechanism may be optionally translated parallel to the axis of winding at the same time it is wound.

The rate of carbon atom addition to the graphenic substrate may be controlled in several different manners. In one embodiment, the growth rate of carbon atom addition to the graphenic substrate is controlled by spatial modulation of an electromagnetic radiation field used to produce excited state carbon species in the fluid phase or used to create reactive excited states at the lattice edge. The population of excited state species may be controlled by the physical location and intensity of the electromagnetic radiation field, such that a population of excited state species may be produced at the graphenic material lattice edge at a desired level to give a predetermined rate of atom addition to the graphenic substrate. In embodiments where there is translation of the graphenic substrate, the templating structure, or both the graphenic substrate and templating structure, the radiation field is modulated about the axis along which translation occurs, such that as the graphenic substrate is translated, the population of excited state species at the lattice edge changes in proportion to the distance between the spatial illumination and the lattice edge. Spatial modulation may be utilized to control the growth rate of carbon atom addition to the graphenic substrate so that the rate of translation is matched by the growth rate of carbon atom addition. A benefit of spatially modulated growth of graphenic materials is that deviations in the growth rate are self-correcting. As such, when the translation rate outpaces or falls behind the growth rate, the growth rate adjusts to match. In one embodiment of this technique, the exciting radiation is in the ultraviolet region of the electromagnetic spectrum. In some embodiments, the ultraviolet radiation has an energy of about 3 eV to about 100 eV. In further embodiments, the ultraviolet radiation has an energy of about 3.1 eV to about 12 eV. In still further embodiments, the ultraviolet radiation has an energy of about 3.5 eV to about 5.5 eV. It will be understood by one skilled in the art that depending on the specific molecule being taken to an excited state in a given application, other forms of electromagnetic radiation and excitation wavelengths can be utilized in the spirit and scope of the disclosure to form the spatially modified radiation field.

In another embodiment to control the rate of carbon atom addition to the graphenic substrate, a gradient may be produced in the chemical potential of the carbon-containing vapor phase. The gradient may be influenced by a gradient in the carbon concentration and/or carbon activity. When the gradient is produced in the chemical potential of the carbon-containing vapor phase, the carbon-containing vapor is delivered parallel to the direction of graphenic substrate and the direction of translation. In some embodiments, the vapor phase optionally contains one or more inert diluent gases or one or more etchant components in addition to the carbon source. The gradient in chemical potential of the carbon-containing vapor phase exists along the common axis created by the graphenic substrate growth and the direction of translation. The gradient in carbon-containing vapor phase chemical potential is maintained in these embodiments through independent modulation of the carbon source comprising the vapor, inert diluent gas in the vapor, and etchant component in the vapor.

A gradient in carbon chemical potential of molten metal baths may also be utilized to control the growth rate of the graphenic substrate. In one embodiment of the present disclosure, a bulk molten metal bath is maintained on one side of a wall of refractory material having a plurality of small (<10 µm) holes penetrating through the wall. In other embodiments, the molten metal bath is maintained on both sides of the wall. In some embodiments, the molten metal bath resides in the plurality of small holes. The wall thickness is sufficient to 1) maintain mechanical integrity, 2) allow the graphenic substrate/template system to reside in the hole, and 3) allow the growing graphenic substrate to extend out of the hole. In embodiments having the molten metal bath maintained on one side of the wall, on the side of the wall opposite the molten metal bath, templating structures are bound to an inert support. The side of the wall housing the bulk molten metal bath is maintained in an atmosphere rich in etchant component, and on the opposite side of the wall is maintained in an atmosphere of carbon-containing source gas. One skilled in the art will recognize that this spatial arrangement produces a gradient of carbon chemical potential in the molten metal baths at the point through which the bulk molten metal penetrates the wall. In a further embodiment, the carbon chemical potential gradient may be controlled through the rate at which the carbon-containing source gas is delivered. In a still further embodiment, the diffusion rate of the carbon-containing source into the molten metal bath produces a carbon chemical potential gradient. The carbon-containing species may include, but is not limited to, at least one of the components selected from the group consisting of methane, ethane, propane, butane, isobutane, 1-butene, cis-2-butene, trans-2-butene, isobutene, ethylene, propene, acetylene, propyne, 1-butyne, 2-butyne, benzene, toluene, carbon monoxide, methanol, ethanol, 1-propanol, 2-propanol, 1-butanol, 2-butanol, 2-methyl-2-propanol, cyclopropane, cyclobutane, acetonitrile, propionitrile, butyronitrile, acetone, butanone, formaldehyde, acetaldehyde, propionaldehyde, and butyraldehyde. Inert diluent gases may include, but are not limited to, at least one component selected from the group consisting of helium, argon, and nitrogen. The etchant component may include, but is not limited to, at least one component selected from the group consisting of water, carbon dioxide, ammonia, and hydrogen. One skilled in the art will recognize that these specific examples are meant to be illustrative of the disclosure herein, and depending on the requirements for a specific application, different components or mixtures of components not explicitly cited may be used to operate within the spirit and scope of the disclosure. In certain other embodiments of molten metal baths described herein, one or more molten metal baths are maintained in pits on a refractory surface, wherein a spatial gradient of carbon chemical potential exists in the molten metal baths as a result of modulating the rate at which carbon-containing vapor is introduced to the molten metal baths and diffusion of carbon into the molten metal solvent takes place. In all of these embodiments, the gradient of carbon chemical potential in the metal bath allows the rate of carbon atom addition to the graphenic substrate to be matched to the rate of translation.

The present disclosure also describes in detail herein a method for producing CNTs, through a process that includes the steps of 1) placing a preformed CNT substrate open on at least one end into proximity of a cylindrical templating structure, such that the CNT is coaxially aligned with the templating structure and contacts the templating structure within thermal variation, 2) binding the CNT substrate and templating structure to separate inert supports capable of independent translation, 3) providing a reactive carbon source in a fluid phase, and 4) depositing carbon from the fluid phase to the open end of the CNT substrate where the CNT substrate lattice edge contacts the cylindrical templating structure while at least one of the CNT substrate or templating structure is translated during the depositing. When the disclosure is practiced in this manner, carbon atoms may be incorporated on the existing CNT substrate under the influence of the cylindrical templating structure to prevent the formation of lattice defects during growth, including end capping of the CNT with carbon atoms.

In some embodiments, the cylindrical templating structure contacts the interior of the CNT substrate. In other embodiments, the cylindrical templating structure contacts the exterior of the CNT substrate. In embodiments wherein the templating structure contacts the interior of the CNT, the templating structure may extend beyond either end of the CNT substrate. In further embodiments wherein the cylindrical templating structure contacts the interior of the CNT substrate, the templating structure is a CNT having a diameter smaller than that of the CNT substrate, such that the templating CNT contacts the interior of the CNT substrate. When the disclosure is practiced in this manner, mechanical independence of the growing CNT substrate from the CNT templating structure is ensured. Likewise, physical and chemical stability of the CNT templating structure to the growth environment is maintained, and carbon atom deposition on the CNT templating structure is suppressed and directed primarily to the CNT substrate.

Figure 2:
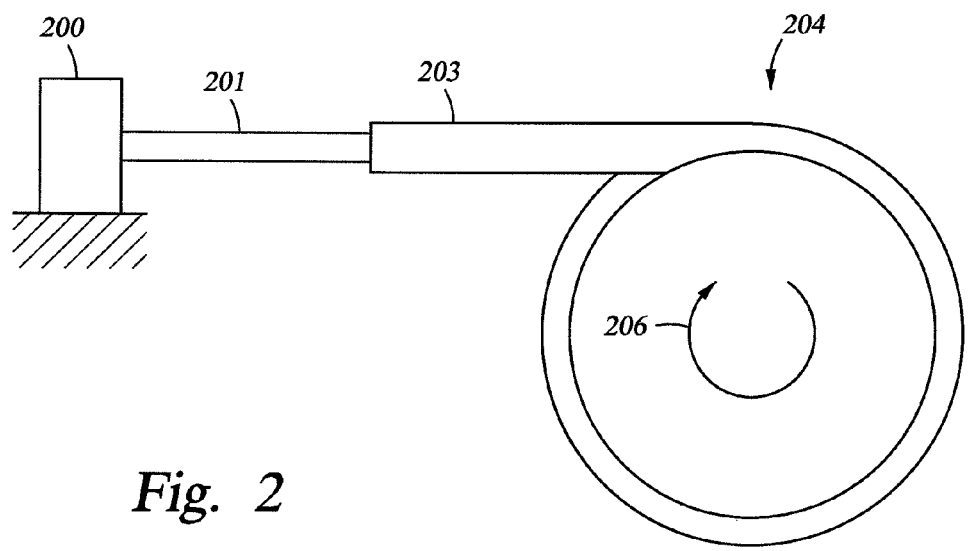
FIG. 2 shows an embodiment of a winding mechanism in the present disclosure used to translate the CNT substrate.
Figure 3A:
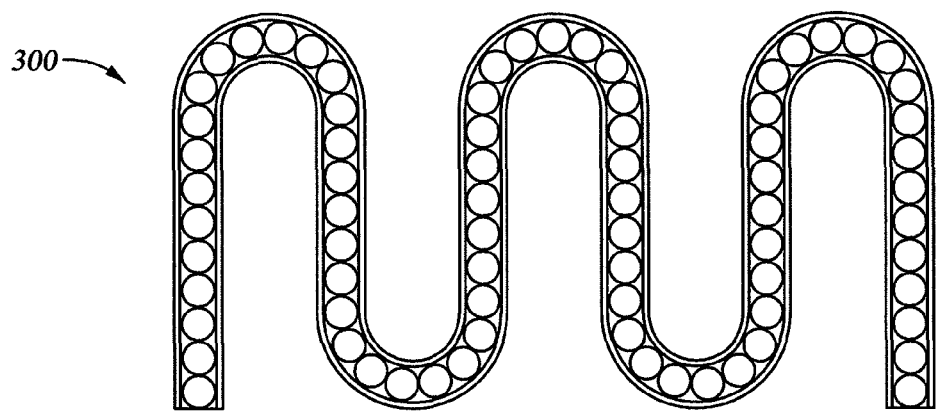
FIG. 3 demonstrates an embodiment of a method whereby an array of CNT seeds can be produced from a single CNT of known type as described in the present disclosure.
Figure 3B:
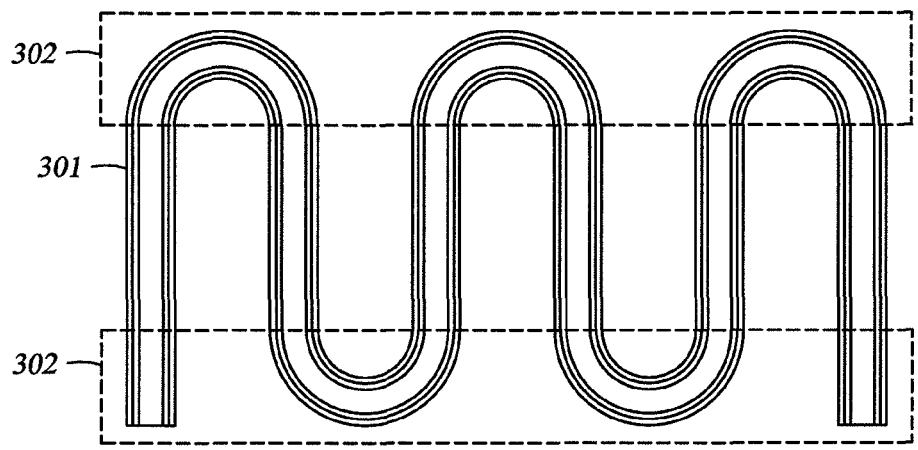
Figure 3C:
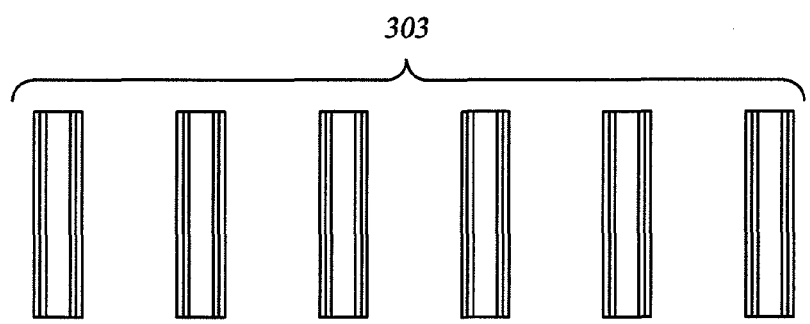
Figure 3D:
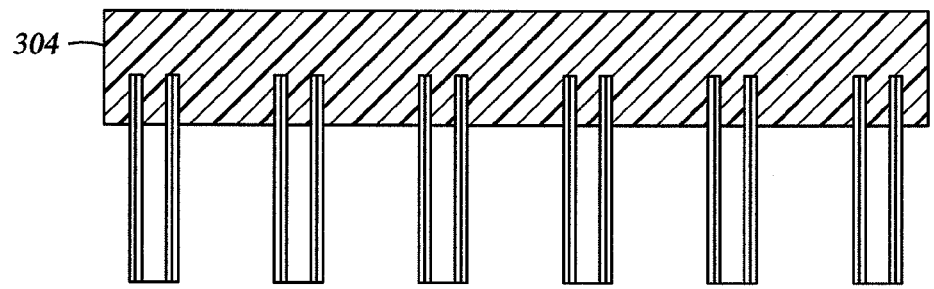
Figure 3E:
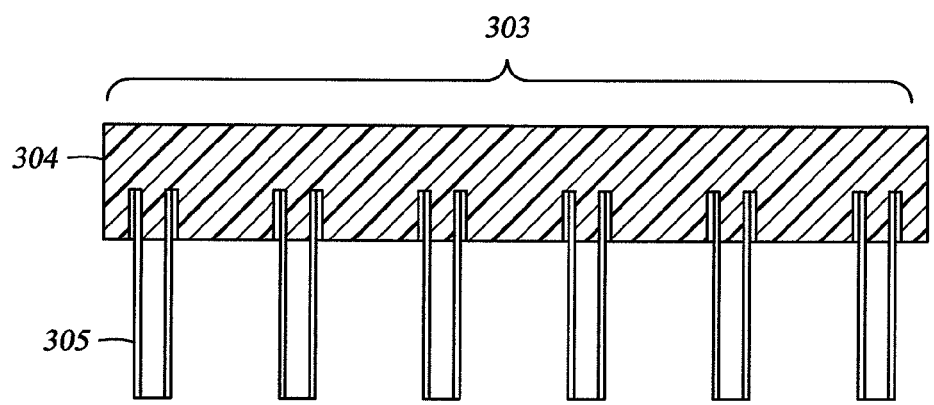
Figure 3F:
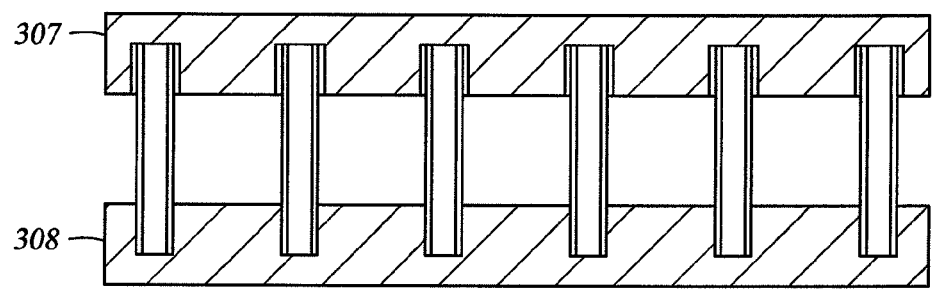

The CNT templating structure and CNT substrate may be attached to independent supports, which are inert toward the conditions utilized for fluid phase growth of CNTs. Suitable support materials depend upon the growth fluid environment. For example, alumina, magnesia or a combination thereof is well suited for molten transition metal baths The arrangement of the CNT templating structure, CNT substrate and inert supports for each is shown in FIG. 1. The supporting surface attachment points for the CNT templating structure 101 and CNT substrate 102 are opposite the point of contact 103 between the CNT templating structure with the CNT substrate along the common cylindrical axis created by 101 and 102. The supports 100 and 105 to which CNT templating structure 100 and CNT substrate 105 are attached are capable of independent motion, such that both the CNT templating structure 101 and CNT substrate 102 may be translated by motion of the supports to which they are attached. In some embodiments, the support to which the CNT substrate is bound is independently translated. In other embodiments, the support to which the CNT templating structure is bound is independently translated. In still further embodiments, both supports are translated concurrently. In certain embodiments, translation of the CNT substrate, CNT templating structure, or both the CNT substrate and CNT templating structure is accomplished through a winding motion, wherein the CNT substrate is wound on to a spool mechanism as it is grown. One embodiment of such a spooling mechanism for translation of the CNT substrate is shown in FIG. 2. CNT substrate 203 is translated from CNT templating structure 201, which is attached to inert support 200. CNT substrate 203 is drawn on to spooling mechanism 204, which is rotated in direction 206 to wind CNT substrate 203 on to the spooling mechanism. In certain embodiments, the spool mechanism may be optionally translated parallel to the axis of winding at the same time it is wound. As a consequence of this translation capability, CNTs produced through templated growth on the CNT substrate are permitted to remain in contact with the CNT templating structure during addition of carbon atoms to the CNT substrate, while not damaging either CNT during the translation process due to minimal sliding friction between the two structures. This arrangement beneficially allows CNT templating structures of finite physical dimension to direct the growth of CNTs to an arbitrary length.

The methods disclosed herein may be utilized to simultaneously produce more than one CNT. A two-dimensional or three-dimensional array of CNT substrates and CNT templating structures may be produced from a CNT of known type through steps comprising 1) positioning the CNT of known type on an inert surface in a known configuration and 2) cutting the CNT of known type into individual CNT/coaxial CNT templating structures. These CNT 'seeds' may then be manipulated and grown through templated addition of carbon to the CNT substrate using any of the methods described herein. In some embodiments of this method, the CNTs are all of known length. In other embodiments of this method, the CNTs are all in known positions and may be manipulated with mechanical precision. Arrayed CNTs and particularly SWCNTs may be particularly useful for nanoscopic electronic devices such as integrated circuits and electronic memory. Two-dimensional arrays may be placed on an electronic device with nanoscale precision, wherein a precise spacing between the CNTs exists. In other applications, arrays may be engineered to act as "word-bit" lines in a memory device.

Methods are disclosed herein for positioning CNT substrates and CNT templating structures. A CNT substrate/CNT template pair may be positioned coaxially. A plurality of CNT substrate/CNT template pairs may be positioned in an array. It will be understood that methods of positioning CNT substrates and CNT templating structures are illustrative of placing a preformed substrate in contact with a templating structure, wherein the preformed substrate and template structure are each CNT-based. This in turn is illustrative of placing a preformed substrate in contact with a templating structure.

According to an embodiment, a method for positioning is illustrated schematically in FIG. 3, wherein CNT substrates and CNT templating structures may be positioned by steps comprising 1) preparing a SWCNT of known length held at each end and suspended in free space, 2) opening at least one end of the SWCNT, 3) filling the open SWCNT with fullerenes such that the fullerenes are in contact within the SWCNT (structure 300), 4) polymerizing the fullerenes to make a second CNT concentric to and inside the SWCNT, 5) placing the resultant DWCNT 301 on a suitable surface in a known configuration, which may be a parallel configuration, through methods such as suspending the DWCNT 301 in a photosensitive polymer above a transparent surface in a known configuration, 6) cutting DWCNT 301 in regions 302 to leave an array of DWCNT 303, which may be a parallel array, 7) performing photolithography to pattern a masking layer 304, such as a refractory metal oxide layer, on one end of the DWCNT array, 8) etching the exposed ends of the DWCNTs to leave exposed SWCNTs 305 and masked DWCNTs 306, 9) removing the masking layer 304, and 10) bonding each end of the resultant DWCNT/SWCNT array to inert supports 307 and 308, which are capable of independent translation. The resultant CNT 'seeds' may then be manipulated and grown through templated addition of carbon to the CNT substrate using any of the methods described herein. The de novo growth of CNTs inside an existing CNT via polymerization of fullerenes is commonly known to those skilled in the art as the 'peapod coalescence'.

In another embodiment of this method, one or more MWCNTs are suspended in a photosensitive polymer above a transparent surface. Photolithography is then performed to pattern metal/ceramic contacts over each MWCNT at two places. The MWCNTs are then held suspended between the metal/ceramic contact points when the structure is inverted. The inverted structure is coated with a photoresist substance, which is then removed around only one of the metal/ceramic contact points per MWCNT to expose the outer layer of each MWCNT at each point. The outer layer of the MWCNTs is opened by methods used to damage CNTs, such as fluorination, light oxidation with singlet oxygen or ozone, electrical burnout methods, or controlled etching using oxidizing baths (ie., piranha, nitric acid, nitric acid/sulfuric acid). One skilled in the art will recognize that these methods are not necessarily an exhaustive compilation of methods capable of opening CNTs, and methods not explicitly listed remain within the spirit and scope of the disclosure. Following opening of the outer CNTs, the open ends of the CNTs are etched using methods known to those skilled in the art, until the open ends of the CNTs are at the desired point between the metal/ceramic contacts. Suitable etching methods include, but are not limited to, hydrogen etching, low temperature piranha etching, and $CO_2$ etching. The structure is thereafter inverted again and aligned and bonded to two separate supports. Carbon atoms are then deposited on to the open end of the resultant CNT substrates from a fluid phase carbon source as at least one of the CNT substrate or the CNT templating structure is translated.

Figure 4A:
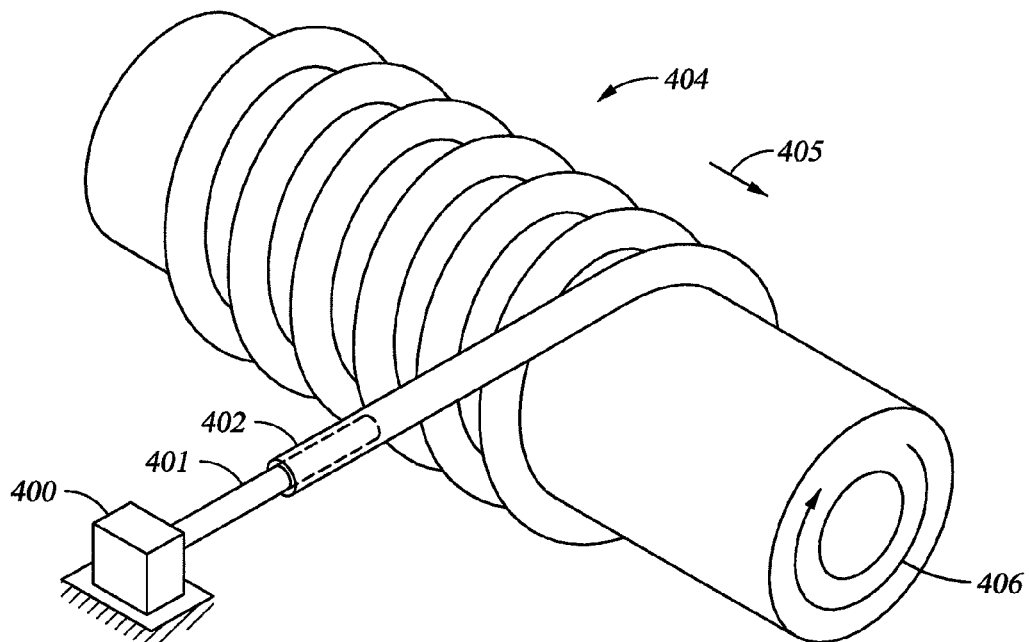
FIG. 4 shows an alternative embodiment for arraying CNTs in the present disclosure, whereby an array of CNT seeds is prepared on the surface of a spooling mechanism from a single CNT.
Figure 4B:
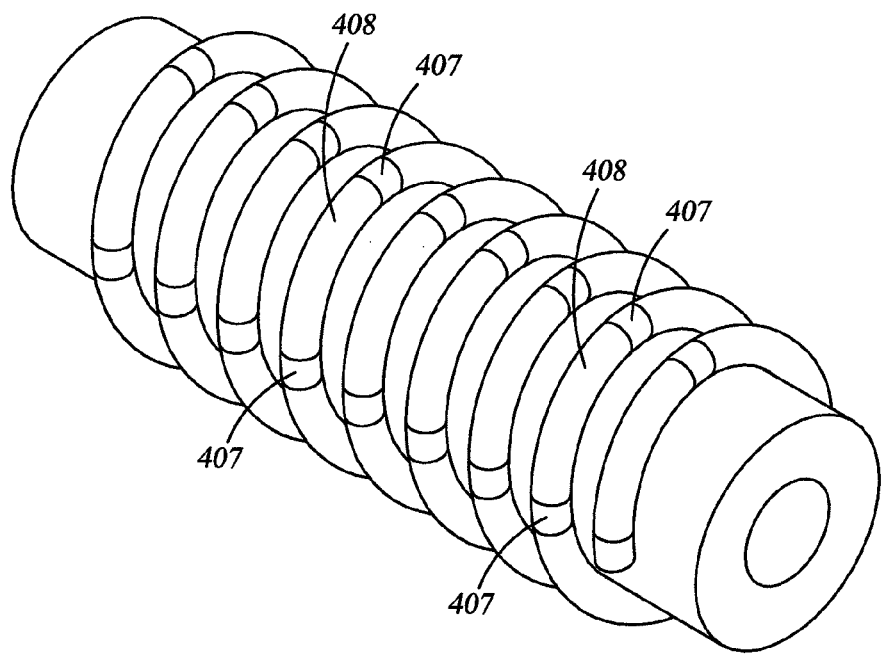

In yet another embodiment of the present disclosure, as illustrated in FIG. 4, a CNT substrate 402 and CNT templating structure 401 bound to inert support 400 may be positioned by steps comprising 1) wrapping CNT substrate 402 open on at least one end around a spool mechanism 404, wherein the spool is rotated in direction 406 to draw the CNT substrate 402 on to the spool while the spool is simultaneously translated in direction 405 parallel to the winding axis, thereby winding the CNT substrate 402 on to the spool 404 to form a helical structure with known pitch, 2) filling the open CNT on the spool with fullerenes such that the fullerenes are in contact within the CNT, 3) polymerizing the fullerenes to make a second CNT inside the original CNT, 4) performing photolithography to cut the CNT into individual CNT segments 408 while removing CNT segments 407, wherein CNT segments 408 are aligned in parallel, 5) performing additional photolithography on the outer CNT of each individual CNT segment 408, wherein the inner CNT extends beyond the outer CNT, 6) transferring the individual CNT segments to a surface suitable for CNT growth, wherein the CNTs segments remain parallel and inner/outer CNTs remain coaxial during the transfer process, and 7) bonding the inner and outer CNTs from each segment to supports that can be independently translated. The aligned CNT 'seeds' and CNT templating structures may thereafter be utilized to grow CNTs using any of the methods described herein. In alternative embodiments of the alignment process, the second CNT may be grown following photolithography to cut the CNT into individual CNT segments 408. In another alternative embodiment of the alignment process, the second CNT may be grown following transfer of CNT segments 408 to the surface suitable for CNT growth.

At least one metal atom may be optionally bonded to the open end of the CNT substrate. In certain embodiments, the metal is selected periodic table groups 3-12, the lanthanide elements, and combinations thereof. Bonding of one or more metals is known to enhance the chemical reactivity of CNT substrates toward addition of carbon atoms. The present disclosure describes methods whereby catalytic metal atoms may be attached to the CNT lattice edge in controlled number and density. In some embodiments, metal deposition to the CNT lattice edge is affected by electrochemical deposition of suitable metal precursors. Variables such as time- or current-limited voltage pulses and solution concentration of metal species may allow electrodeposition to be carried out at variable rates for a given voltage in order to control the metal density on the CNT lattice edge. In other embodiments, metal atoms are attached to the CNT lattice edge by coupling reactions between mixtures of metal atom bearing species and non-metal bearing species of comparable reactivity with reactive groups on the CNT lattice edge. The density of metal atom incorporation on the CNT lattice edge may be controlled simply by adjusting the ratio of metal-bearing to non-metal bearing species in the coupling reaction. Suitable metal atom bearing species may include, but are not limited to, functionalized metallocenes (e.g., ferrocene), metal-EDTA derivatives, and related organometallic and metal-ligand complexes. Non-metal bearing species having comparable reactivity to these specific examples may include the functionalized non-metallated ligand or similar compound having comparable reactivity toward the reactive groups on the CNT lattice edge. One skilled in the art will recognize that a wide variety of non-metallated compounds having like reactive functionality to the functionalized metal bearing compound may be used to control the density of metal atom deposition. These competing non-metallated species may bear no structural resemblance to the metallated species in certain instances, while still maintaining comparable chemical reactivity to the parent metal bearing compound. A convenient functional group for attaching the metal bearing species and their non-metal bearing counterparts to CNT lattice edges is a carboxylic acid, although other functional groups may be manipulated to couple with CNT lattice edges through methods known to those skilled in the art. In the instance where the reactive functional group on the metal bearing compound is a carboxylic acid, the metal bearing species may be attached to surface CNT lattice edge OH groups via an esterification reaction through various coupling reaction methodologies known to those skilled in the art. The range of reactions utilized to couple to the CNT material lattice edge is not limited to esterification, and other coupling strategies including, but not limited to, alkoxylation and amidation are viable alternatives for linking metal atoms to the CNT lattice edge. In still further embodiments, ligand binding sites on the CNT lattice edge may be reacted with metal ion solutions having variable concentration and pH. The ligand binding sites may be pre-existing in certain embodiments, including, but not limited to, terminal carboxylic acid moieties at the CNT lattice edge. In other embodiments, a suitable ligand may be synthesized on the CNT lattice edge. One skilled in the art will recognize that certain metal ion solutions will require pH and reaction temperatures having values in a defined range to efficiently bind to the surface ligands. Furthermore, for a given metal salt, a finite attainable concentration range and chemical compatibility profile will be realized due to the innate physical properties of the metal salt.

A molecule in an excited state may comprise the fluid phase source of carbon atoms for addition to the CNT substrate, wherein increased reactivity of the excited state carbon source with the CNT substrate is realized. When the vapor phase contains an excited state species, the collision rate of the excited state species in the vapor phase may be sufficiently low with non-excited state vapor phase molecules so as not to generate extraneous reactive species. In some embodiments, the excited state is a vibrational excited state. In other embodiments, the excited state is a radical state. Suitable radical states may include, but are not limited to, $C_2H$ and $C_2H_3$. In still more embodiments, the excited state is an excited electronic state. A representative excited electronic state molecule is non-dissociatively excited acetylene, which has been excited by electromagnetic radiation having a wavelength of about 220 nm. One skilled in the art will recognize that other excited electronic state molecules can also be utilized within the spirit and scope of the disclosure. The foregoing list of excited state species is meant to be representative of excited state entities suitable for bringing the disclosure to practice and should not be considered limiting for this purpose. One skilled in the art will recognize that an energetically excited state species having suitable reactivity for a given application may be generated by a number of techniques and utilized equivalently in the methods described herein. The vapor phase containing the excited state carbon species may optionally contain an inert diluent gas and an etchant component. Suitable diluent gases may include, but are not limited to, at least one component selected from the group consisting of helium, argon, and nitrogen. Suitable etchants may include, but are not limited to, at least one component selected from the group consisting of water, carbon dioxide, ammonia, and hydrogen. In certain embodiments, it may be advantageous to add both the etchant component and inert diluent gas either separately or concurrently.

In certain embodiments, the rate at which the CNT substrate is translated away from the CNT templating structure is matched by the growth rate of the CNT substrate through addition of carbon atoms. If during addition of atoms to the CNT substrate, the rate at which the CNT templating structure and CNT lattice edge are translated apart is too slow, the CNT substrate will eventually contact the inert support to which the CNT templating structure is bound. Likewise, if during addition of atoms to the CNT substrate, the rate at which the CNT templating structure and CNT substrate are translated apart is too rapid, then growth of the CNT substrate will not keep pace with the rate of translation and the CNT substrate will eventually become disconnected from the CNT templating structure.

The rate of carbon atom addition to the CNT substrate may be controlled in several different manners. In one embodiment, the growth rate of carbon atom addition to the CNT substrate is controlled by a spatial modulation of an electromagnetic radiation field, such that the population of excited state carbon-containing fluid phase species at the CNT lattice edge is regulated by the spatial location of the radiation field relative to the lattice edge. One skilled in the art will recognize that the population of excited state species may be controlled by the physical location and intensity of the electromagnetic radiation field, such that the population of excited state species may be regulated to a desired level to give a pre-determined rate of carbon atom addition to the CNT substrate. In embodiments where there is translation of the CNT substrate, the CNT templating structure, or both the CNT substrate and CNT templating structure, the radiation field may be modulated about the axis along which the translation occurs, such that as the translation occurs, the population of excited state species changes in proportion to the distance between the illumination and the CNT substrate lattice edge. Spatial modulation may therefore be utilized to control the growth rate of carbon atom addition to the CNT substrate so that the rate of translation is matched by the growth rate of carbon atom addition. A benefit of spatially modulated growth of CNTs is that deviations in the growth rate are self-correcting. As such, when the translation rate outpaces or falls behind the growth rate, the growth rate adjusts to match. In one embodiment, the exciting radiation is in the ultraviolet region of the electromagnetic spectrum. In some embodiments, the ultraviolet radiation has an energy of about 3 eV to about 100 eV. In further embodiments, the ultraviolet radiation has an energy of about 3.1 eV to 12 eV. In still further embodiments, the ultraviolet radiation has an energy of about 3.5 eV to about 5.5 eV. It will be understood by one skilled in the art that depending on the specific molecule being taken to an excited state in a given application, other forms of electromagnetic radiation and excitation wavelengths could be utilized in the spirit and scope of the disclosure to form the spatially modified radiation field.

The fluid phase source of atoms for addition to CNT substrates in the present disclosure may be a carbon source dissolved in a molten metal, wherein physical contact is maintained between the molten metal and the CNT substrate. The molten metal is at least one component selected from periodic table groups 1-12, the lanthanide elements, and alloys thereof. In some embodiments, the metal may be at least one component selected from the group consisting of Fe, Co, Ni, Au and alloys thereof. In one embodiment, the carbon source is a solid in contact with the molten metal. Such a carbon source may also be preferentially dissolved instead of the CNT substrate. This feature may be achieved through various techniques including but not limited to applying electrical potentials or by constructing the solid carbon source from a less energetically stable carbon form, such as amorphous carbon In other embodiments, the carbon source in the molten metal bath is introduced from a vapor phase carbon-containing species. One skilled in the art will recognize that the vapor phase carbon-containing species may derive from gases, liquids, or solids having low vapor pressures. Said carbon-containing compounds may contain at least one element other than carbon, and may include, but not be limited to, the group consisting of hydrogen, oxygen, sulfur, nitrogen, fluorine, chlorine, bromine, iodine, silicon and phosphorus. It is well known in the art that presence of other species in a molten metal solution may affect the carbon activity and growth mode of carbon deposition from the solution. For example, the presence of other elements may reduce the surface tension of the molten metal bath and lower the interfacial energy between the metal melt and non-wetting surfaces it contacts. Sulfur and copper are particularly known to decrease the surface energy of carbon-containing molten metal melts, and these elements may optionally be included in the molten metal baths described herein. Non-metallic elements including, but not limited to Si and P, may optionally be included in the melt to modify the effective carbon saturation (activity) and deposition potential. In the present disclosure, the carbon-containing species may include, but is not limited to, at least one component selected from the group consisting of methane, ethane, propane, butane, isobutane, 1-butene, cis-2-butene, trans-2-butene, isobutene, ethylene, propene, acetylene, propyne, 1-butyne, 2-butyne, benzene, toluene, carbon monoxide, methanol, ethanol, 1-propanol, 2-propanol, 1-butanol, 2-butanol, 2-methyl-2-propanol, cyclopropane, cyclobutane, acetonitrile, propionitrile, butyronitrile, acetone, butanone, formaldehyde, acetaldehyde, propionaldehyde, and butyraldehyde. In a further embodiment of the disclosure, the vapor phase carbon-containing molecule may be optionally mixed with an inert diluent gas, such that the molten metal source is exposed concurrently to both the vapor phase carbon-containing compound and inert diluent gas. Suitable diluent gases may include, but are not limited to, at least one component selected from the group consisting of helium, argon, and nitrogen. In a still further embodiment, the vapor phase carbon-containing molecule may be mixed with an etchant component, such that the molten metal source is exposed concurrently to both the vapor phase carbon-containing compound and etchant component. In certain embodiments, it is desirable to add both the etchant component and diluent gas, either concurrently or separately, along with the carbon-containing compound. Suitable etchants may include, but are not limited to, at least one component selected from the group consisting of water, carbon dioxide, ammonia, and hydrogen. More than one CNT may be grown simultaneously from individual, isolated carbon-containing molten metal baths in further embodiments of this method.

Molten metal baths are embodied in certain instances wherein one or more molten metal baths are maintained in individual pits on a refractory surface. In this embodiment, carbon atoms are added to one or more CNT substrates from a carbon atom source through templated growth, while at least one of the refractory surface and inert support binding the CNT substrate is independently translated. In another embodiments of molten metal baths, a bulk molten metal bath is maintained on one side of a wall of refractory material having a plurality of small (<10 μm) holes penetrating completely through the wall. In other embodiments, the molten metal bath is maintained on both sides of the wall. In additional embodiments, the molten metal bath resides in the plurality of small holes. The wall thickness is sufficient to 1) maintain mechanical integrity, 2) allow the CNT substrate/CNT template system to reside in the hole, and 3) allow the growing CNT substrate to extend out of the hole. On the side of the wall opposite the bulk molten metal bath, CNT templating structures may be bound to an inert support which is stationary with respect to the refractory material wall. In an alternative embodiment of this configuration, the CNT templating structures may be bound directly to the refractory surface wall. In either configuration, carbon atoms are added to the CNT substrate as translation occurs using any of the templated growth methods described herein. In yet another embodiment of molten metal baths, the molten metal bath is a bead of molten metal localized at the open end of a free-standing CNT templating structure.

The rate of carbon atom addition to the CNT substrate may be controlled by producing a gradient in the chemical potential of the carbon-containing vapor phase. In some embodiments, the vapor phase optionally contains one or more inert diluent gases or one or more etchant components in addition to the carbon source. The gradient in chemical potential of the carbon-containing vapor phase exists on the axis of the CNT substrate along the direction of translation. The gradient in carbon-containing vapor phase chemical potential is maintained in these embodiments through independent modulation of the carbon source comprising the vapor, inert diluent gas in the vapor, and etchant component in the vapor.

The growth rate of the CNT substrates may be controlled by creating a gradient of carbon chemical potential in the molten metal baths as described in the disclosure. In one embodiment, the growth rate of carbon atom addition to the CNT substrate is controlled by introducing the carbon-containing vapor at such a rate that a spatial gradient of carbon chemical potential exists within the metal bath. In another embodiment, the growth rate of carbon atom addition to the CNT substrate is controlled by steps comprising 1) maintaining an etchant component atmosphere on one side of a refractory substance wall confining a bulk molten metal bath, wherein a plurality of small (<10 μm) holes penetrate completely through the wall, and 2) delivering a carbon-containing source gas on the side of the wall opposite the bulk molten metal bath, wherein one or more CNT templating structures and CNT substrates are positioned on the side of the wall opposite the bulk molten metal bath; the carbon-containing vapor phase is delivered parallel to the direction of CNT substrate growth; and the carbon-containing vapor phase maintains a concentration gradient along the direction of CNT substrate translation through modulation of at least one of the carbon source, inert diluent gas, and etchant component in the vapor. One skilled in the art will recognize that this spatial arrangement produces a gradient of carbon chemical potential in the molten metal baths at the point through which the bulk molten metal penetrates the wall. Further, a skilled artisan will recognize that the chemical potential gradient will control the growth rate of carbon atom addition to the CNT substrate as the CNT substrate is translated from the CNT templating structure. In a further embodiment, the diffusion rate of the carbon source into the molten metal bath produces a carbon chemical potential gradient. The vapor phase carbon-containing species may include, but is not limited to, at least one component selected from the group consisting of methane, ethane, propane, butane, isobutane, 1-butene, cis-2-butene, trans-2-butene, isobutene, ethylene, propene, acetylene, propyne, 1-butyne, 2-butyne, benzene, toluene, carbon monoxide, methanol, ethanol, 1-propanol, 2-propanol, 1-butanol, 2-butanol, 2-methyl-2-propanol, cyclopropane, cyclobutane, acetonitrile, propionitrile, butyronitrile, acetone, butanone, formaldehyde, acetaldehyde, propionaldehyde, and butyraldehyde. The inert diluent gas may include, but is not limited to, at least one component selected from the group consisting of helium, argon, and nitrogen. The etchant component may include, but is not limited to, at least one component selected from the group consisting of water, carbon dioxide, ammonia, and hydrogen. One skilled in the art will recognize that these specific examples are meant to be illustrative of the disclosure described herein, and depending on the properties required for a specific application, different components or mixtures of components not explicitly cited may be used to operate within the spirit and scope of this disclosure.

In another embodiment of the disclosure provided herein, an electrical potential is applied to the CNT substrate to produce a reactive carbon species from the fluid phase for addition to the CNT substrate. In an alternative embodiment, the electrical potential enhances the CNT substrate reactivity. In some embodiments, the electrical potential is utilized to produce carbon-containing ionic radicals for addition to the CNT substrate through an electrolytic decomposition reaction of suitable carbon radical precursors. The carbon-containing ionic radicals may include, but are not limited to, methyl, ethyl, and vinyl radicals. Electrochemical deposition has been previously shown to produce MWCNTs, but the disclosure embodied herein is distinguished from and superior to known methods in the use of a template to direct CNT growth. The electrical potential may also be applied in the presence of an electrically charged carbon source, which results in attraction of the charged carbon atom species to the CNT substrate. In a particular embodiment, the charged carbon source may be dissolved in a molten metal solvent. In another embodiment, the charged carbon source may be dissolved in an ionic liquid solvent. The ionic liquid solvent may be a molten alkali halide or alkaline halide. It has been widely reported that alkali metal carbides and alkaline metal carbides are soluble in certain alkali metal halide and alkaline metal halide fused salt systems. These carbides dissociate to give unbound acetylide ($C_2^{-2}$) ions in the molten salt solution. It has been demonstrated that carbon can be electrochemically deposited and redissolved under quasi-reversible conditions in such systems. It has also been demonstrated that closed graphenic structures are stable in fused alkali halide salt systems and that these environments are catalytic to the restructuring of graphenic structures into minimum energy configurations. The electrical potential may further be applied in the presence of a neutral and polarizable carbon source, which results in the establishment of a concentration gradient within the region throughout which the neutral and polarizable carbon source is dispersed.

In certain embodiments wherein an electrical potential is applied to a CNT substrate, the CNT templating structure has a lower electrical conductivity than the tip of the growing CNT substrate. In this instance, the electric field becomes concentrated at the tip of the growing CNT substrate. The electrical potential may be adjusted so that the tip of the CNT substrate develops an excess of electron density (i.e., becomes electron rich). When the CNT substrate tip becomes electron rich, the CNT substrate tip may undergo a Diels-Alder type reaction, wherein the CNT substrate tip serves as the diene component of the reaction. Suitable dienophile partners for coupling to the CNT substrate diene may include, but are not limited to, vinyl acetic acid, acrylic acid, acrylonitrile and dicyanoacetylene. The electrical potential may also be adjusted such that the CNT substrate tip develops a net deficiency of electron density (ie., becomes electron poor). Comparable cycloaddition reactions to the electron-deficient CNT substrate may be envisioned by those skilled in the art.

Figure 5:
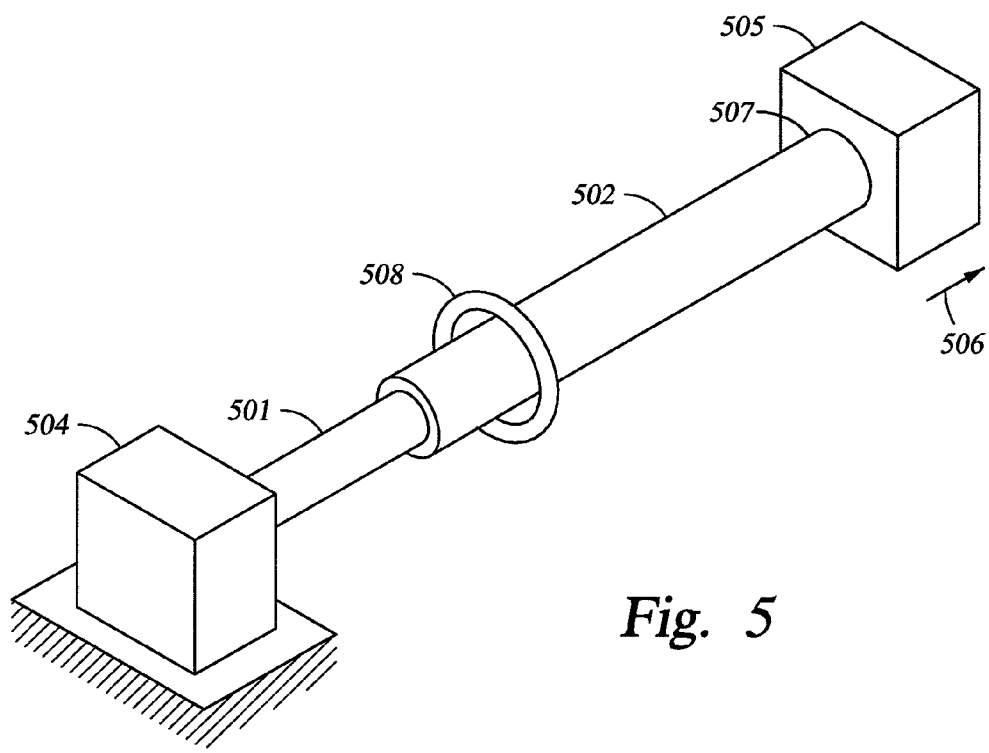
FIG. 5 shows an embodiment of self-regulated growth of CNTs under electrochemical deposition conditions.

An electric field bias may be applied to the growing CNT substrate such that the field gradient and charge concentration are varied in the growing CNT substrate through choice of electrode geometry. In certain embodiments, the electric field bias may be used to manually regulate the rate of CNT substrate growth. In other embodiments, the electric field bias may be used to self-regulate the rate of CNT substrate growth. Self-regulation of CNT substrate growth may be accomplished by steps illustrated in FIG. 5 comprising 1) contacting the CNT substrate 502 with an electrically insulating template structure 501, each individually bound to supports 504 and 505, 2) applying an electrical potential to CNT substrate 502 through inert support 505, wherein position 507 is the electrical contact point of CNT substrate 502, and further wherein the counter-electrode is in a ring configuration 508 surrounding CNT substrate 502 at a distance away from the point of electrical contact 507, and 3) adding carbon atoms to CNT substrate 502 as 502 is translated in direction 506, such that the rate of carbon atom addition to CNT substrate 502 is proportional to the electric field gradient established at the tip of CNT substrate 502. In certain embodiments, the electrical potential is applied at any point on support 505. In additional embodiments, an electrical potential is applied to CNT templating structure 501 through inert support 504. In further embodiments, the electrical potential is applied at any point along CNT substrate 502. When the electrical contact point is applied along the CNT substrate 502, the site of contact is at point not susceptible to electrochemical reactions and non-interfering with the electric field established at the ring counter-electrode. The chosen electrode geometry ultimately governs placement of ring electrode 508 in this configuration. In some embodiments, the radius of the ring counter-electrode determines the distance the ring counter-electrode is placed away from the point of surface electrical contact 507. Suitable electrically insulating templates may include, but are not limited to boron nitride nanotubes and large band gap CNTs. In the electrode orientation embodied in FIG. 5, one skilled in the art will recognize that the electrical field in the CNT substrate tip is enhanced as the tip nears the ring electrode, thus leading to a self-regulated rate matching of translation to the CNT substrate growth rate.

In another aspect of the disclosure, an electrical potential applied to the growing CNT substrate enhances the deposition rate of carbon to the growing CNT substrate wherein the CNT is translated from an electrically insulating template structure which is coaxial and external to the CNT substrate in a carbon-atom source environment. Specific examples of the electrically insulating external template may include, but are not limited to, boron nitride nanotubes and large band gap CNTs, both of which have a diameter larger than the growing CNT substrate. In one embodiment of this disclosure, the carbon source is carbon dissolved in a molten metal, wherein the metal is at least one component selected from periodic table groups 1-12, the lanthanide elements, and alloys thereof. In a further embodiment of this method, the metal is molten cobalt.

Figure 6:
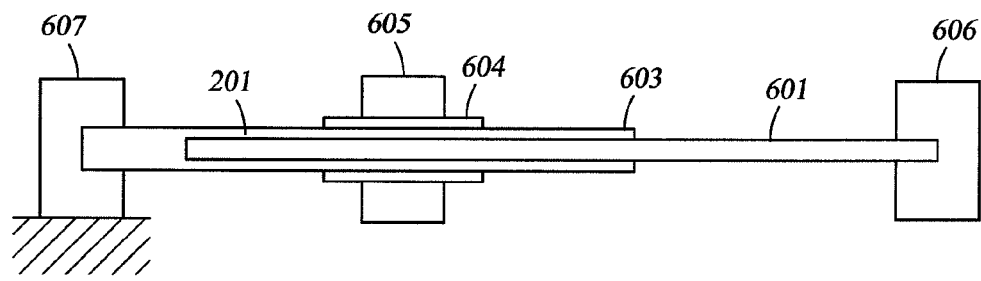
FIG. 6 shows an embodiment of a CNT positional control system.

Another aspect of the disclosure provided herein relates to a method for achieving positional control of CNT substrates by means of a position-controlling structure contacting the exterior of each CNT substrate as it is translated as shown in FIG. 6. Positional control of grown CNT substrates is accomplished by steps comprised of 1) positioning a wall structure 605 completely penetrated by one or more SWCNT conduits 604 between the inert support anchoring point 607 of CNT substrate 602 and the CNT substrate lattice edge 603, wherein each CNT substrate 602 penetrates wall structure 605 through the interior of a SWCNT conduit 604; the SWCNT conduits 604 are larger than the CNT substrate 602 they contain by at least one graphite lattice unit spacing; and the inert support 607 is capable of translational motion, 2) growing CNT substrate 602 via templated growth from a fluid phase carbon source, wherein templating structure 601 is bound to inert support 606, and 3) translating the grown CNT substrate 602 through wall structure 605 separating the fluid phase carbon source from inert support 607, wherein translation of CNT substrate 602 is affected through a SWCNT conduit 604. In certain embodiments, the grown CNT substrate is translated through the position-controlling structure 604 via a spooling motion.

In certain embodiments CNTs may be prepared via templated growth, wherein the CNT substrate lies within the interior of an external templating structure. In this embodiment, the open end of the internalized CNT substrate may optionally be bonded to a nanoparticle, and the end of the CNT substrate opposite the nanoparticle is attached to an inert support. In certain embodiments, the internal CNT substrate may be translated through movement of the inert support as atoms are added to the CNT substrate.

Figure 7:
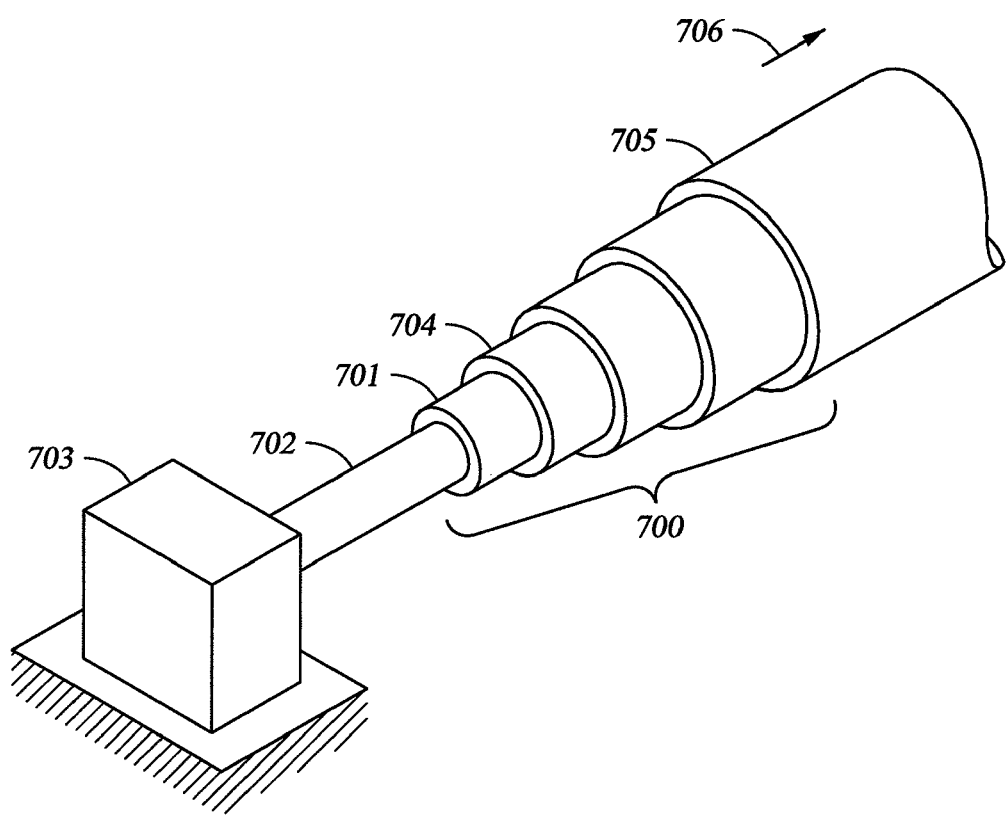
FIG. 7 shows an embodiment whereby multiple coaxial CNTs can be grown simultaneously to form a beveled CNT tip.

The disclosure herein also describes an embodiment wherein a CNT simultaneously functions as both a growth substrate and templating structure as shown in FIG. 7. In this embodiment, a MWCNT has its innermost CNT 701 contacting a templating structure 702, which is bound to inert support 703. As carbon atoms are added to innermost CNT 701 during translation of the MWCNT, the innermost CNT 701 serves as a template of increasing length to the next layer CNT 704. This process applies sequentially to all CNTs 704 in the MWCNT until the outermost CNT 705 is reached. The outermost CNT 705 serves only as a growth substrate. Templated growth embodied in this sense can be used to create MWCNTs having a beveled tip 700.

The disclosure herein also provides a method for enhancing graphene lattice edge reactivity by exciting non-thermalized excited states in the graphene lattice edge. In a specific embodiment of this process, a method for production of CNTs is comprised of 1) placing a preformed CNT substrate open on at least one end into proximity of a cylindrical templating structure, wherein the CNT substrate contacts the cylindrical templating structure within thermal variation and aligns with the cylindrical templating structure in a coaxial fashion within thermal variation, 2) binding a CNT substrate and cylindrical templating structure to separate inert supports, wherein each support may be independently translated, 3) producing non-thermalized excited states in a CNT substrate, and 4) depositing carbon from a fluid phase to the open end of a CNT substrate where the CNT substrate lattice edge contacts the cylindrical templating structure, while at least one of the CNT substrate or cylindrical templating structure is translated during the depositing. In some embodiments, the CNT lattice edge is brought into a non-thermalized excited state through direct excitation of edge localized states. In polyaromatic systems, "zig-zag" configurations are known to have localized electron sites which populate the Dirac point in the density of states. Transitions from these edge localized states allow the direct excitation of non-thermalized states at the CNT lattice edge to enhance reactivity. The edge localized states may include, but are not limited to, benzyne and carbyne sites on the CNT lattice edge. In other embodiments, plasmon excitation of the CNT substrate produces non-thermalized edge state excitation. In certain embodiments, UV irradiation produces a CNT lattice edge substrate having non-thermalized excited states.

The CNT substrate reactivity toward carbon atom addition may also be enhanced by exciting non-thermalized excited states in CNT substrates bound to at least one metal atom. The metal atoms may be at least one component chosen from periodic table groups 3-12, the lanthanide elements, and combinations thereof. The non-thermalized excited state may be produced through excitation of the metal-carbon bond. Alternatively, the non-thermalized excited state may be produced through direct excitation of the metal atom, including, but not limited to, interaction of the metal atom with X-rays.

EXPERIMENTAL EXAMPLES

Prophetic Example 1

Acetylides in Alkali Halide Fused Salts

A fused molten salt environment comprised of one or more alkali metal halides will be prepared, wherein the cationic alkali metal species will be chosen from Li, Na, and K and the anionic halogen component will be chosen from F, Cl, and Br. Feedstock species comprised of at least one alkali acetylide, alkaline acetylide, or a combination thereof will thereafter be prepared in the molten alkali halide solvent. A graphenic substrate/templating system will be brought into contact in the molten alkali halide solvent, and the graphenic substrate/templating system will be translated apart as carbon is electrochemically added to the graphenic substrate under quasi-equilibrium conditions. The reaction temperature will be sufficient to render the solvent composition liquid and provide activation energy sufficient to anneal deposited carbon. Other carbon sources are envisioned to be utilized in this method, including, but not limited to, alkali metal carbonates. A method to generate carbide ions in situ from a carbon electrode or from external acetylene bubbled over the cathode are also envisioned. In general the potential required to deposit carbon at quasi-equilibrium conditions will depend upon the salt system, temperature and counter-electrode, and will be directly found through a standard CV (cyclic voltammetry) experiment to identify the acetylide oxidation potential. In general the working electrode will be the graphenic material templated growth system. The counter (auxiliary) and reference electrodes will simply be compatible with the cell; that is they will be stable in and not contaminate the molten alkali halide environment, and they will not degrade during the reduction of alkali ions.

Prophetic Example 2

Iron/Cobalt Alloy Solvent System

The ability of certain transition metals to dissolve carbon without forming stable carbides is well known in metallurgy and widely exploited in the synthesis of carbon nanomaterials such as CNTs.

A molten metal ternary alloy comprised of cobalt, iron, and carbon will be prepared and liquified between about 1115-1135° C. The ratio of cobalt to iron in the ternary alloy will be between about 3:17 to about 3:7. The carbon concentration in the ternary alloy will be about 14 to about 17 atomic percent. Carbon saturation will be achieved by placing the molten cobalt/iron alloy in contact with a carbon source, including but not limited to amorphous carbon. Once the ternary allow has been established and temperature adjusted to 1115-1135° C., a graphenic substrate/templating system will be brought into contact in the molten alloy. The environmental pressure will be maintained below atmospheric pressure and ideally will be maintained between 10-400 torr to avoid increasing the likelihood of diamondoid carbon formation while keeping the molten metal bath from evaporating. The temperature will be raised to slightly above these conditions ($\approx$1150° C.), and carbon will then be deposited into the graphenic substrate when the carbon chemical potential is just above saturation. As the graphenic substrate is extended, translation will be performed to maintain the graphenic substrate and templating structure in contact with one another. The solvent system will be maintained at near equilibrium carbon saturation conditions to deliver templated growth of highly perfect graphenic materials.

What is claimed is:

1. A method for production of a CNT, comprising
    placing a preformed CNT substrate open on at least one end in contact with a cylindrical templating structure;
    providing a reactive source of carbon in a fluid phase;
    depositing carbon from the fluid phase to the open end of said CNT substrate; and,
    translating at least one of said CNT substrate and said cylindrical templating structure during the depositing, while maintaining the contact,
    wherein the cylindrical templating structure contacts the interior of the CNT substrate.

2. The method of claim 1, wherein the cylindrical templating structure is a CNT having a diameter smaller than that of the CNT substrate.

3. The method of claim 2, wherein the placing comprises:
    positioning the CNT substrate and the CNT templating structure.

4. The method of claim 3, wherein the positioning comprises
    coaxially positioning the CNT substrate and the CNT templating structure.

5. The method of claim 3, wherein the positioning comprises:
    positioning the CNT substrate and the CNT templating structure in an array of CNT substrate/CNT templating structure pairs.

6. The method of claim 3, wherein the positioning comprises:
    coaxially positioning the CNT substrate and the CNT templating structure; and
    positioning the CNT substrate and the CNT templating structure in an array of CNT substrate/CNT templating structure pairs.

7. A method for production of a CNT, comprising
    placing a preformed CNT substrate open on at least one end in contact with a cylindrical templating structure;
    providing a reactive source of carbon in a fluid phase;
    depositing carbon from the fluid phase to the open end of said CNT substrate; and,
    translating at least one of said CNT substrate and said cylindrical templating structure during the depositing, while maintaining the contact, wherein at least one metal atom selected from the group consisting of periodic table Groups 3-12, the lanthanide elements, and combinations thereof is bonded to the open end of the CNT substrate, wherein the metal atoms are attached to the CNT substrate by coupling reactions.

8. A method for production of a CNT, comprising
placing a preformed CNT substrate open on at least one end in contact with a cylindrical templating structure;
providing a reactive source of carbon in a fluid phase;
depositing carbon from the fluid phase to the open end of said CNT substrate; and,
translating at least one of said CNT substrate and said cylindrical templating structure during the depositing, while maintaining the contact,
wherein at least one metal atom selected from the group consisting of periodic table Groups 3-12, the lanthanide elements, and combinations thereof is bonded to the open end of the CNT substrate,
wherein ligands on the CNT substrate are reacted with metal ion solutions.

9. A method for production of a CNT, comprising
placing a preformed CNT substrate open on at least one end in contact with a cylindrical templating structure;
providing a reactive source of carbon in a fluid phase;
depositing carbon from the fluid phase to the open end of said CNT substrate; and,
translating at least one of said CNT substrate and said cylindrical templating structure during the depositing, while maintaining the contact,
wherein the fluid phase is a gas comprising:
(a) a carbon source in an excited state,
(b) an inert diluent gas, and
(c) an etchant component.

10. The method of claim 9, wherein the growth rate of the preformed CNT substrate is controlled by a spatially modulated electromagnetic radiation field.

11. A method for production of a CNT, comprising
placing a preformed CNT substrate open on at least one end in contact with a cylindrical templating structure;
providing a reactive source of carbon in a fluid phase;
depositing carbon from the fluid phase to the open end of said CNT substrate; and,
translating at least one of said CNT substrate and said cylindrical templating structure during the depositing, while maintaining the contact,
wherein the fluid phase comprises a carbon source dissolved in a molten metal selected from the group consisting of periodic table Groups 1-12, the lanthanide elements, and alloys thereof, wherein physical contact is maintained between the molten metal and a lattice edge of the preformed CNT substrate.

12. The method of claim 11, wherein the carbon source in the fluid phase comprises:
(a) a carbon source delivered from a vapor phase carbon-containing species containing least one element other than carbon selected from the group consisting of hydrogen, oxygen, sulfur, nitrogen, fluorine, chlorine, bromine, iodine, silicon and phosphorus,
(b) an inert diluent gas, and
(c) an etchant component.

13. The method of claim 11, wherein a plurality of molten metal baths are maintained in individual pits on a refractory surface.

14. The method of claim 11, wherein a bulk molten metal bath is maintained on one side of a wall of refractory material, wherein a plurality of small holes completely penetrate through the refractory material wall.

15. The method of claim 11, wherein a bulk molten metal bath is maintained on both sides of a wall of refractory material, wherein a plurality of small holes completely penetrate through the refractory material wall.

16. The method of claim 11, wherein molten metal baths are maintained within a plurality of small holes penetrating through a refractory material wall.

17. The method of claim 11, wherein a molten metal bath is a bead of molten metal localized at the open end of a free-standing CNT templating structure.

18. The method of claim 13, wherein the growth rate of carbon atom addition to a lattice edge of the preformed CNT substrate is controlled by the rate of introduction of the carbon-containing vapor.

19. The method of claim 14, wherein the growth rate of the CNT lattice edge is controlled by steps comprised of
(a) maintaining an etchant atmosphere on the bulk molten metal bath side of the wall;
(b) delivering a carbon-containing source gas on the side of the wall opposite the bulk molten metal bath, wherein
(b1) templating structures and CNT substrates are positioned on the side of the wall opposite the bulk molten metal bath,
(b2) the carbon-containing vapor phase is delivered parallel to the direction of CNT lattice growth, and
(b3) the carbon-containing vapor phase maintains a concentration gradient along the direction of CNT translation.

20. A method for production of a CNT, comprising
placing a preformed CNT substrate open on at least one end in contact with a cylindrical templating structure;
providing a reactive source of carbon in a fluid phase;
depositing carbon from the fluid phase to the open end of said CNT substrate; and,
translating at least one of said CNT substrate and said cylindrical templating structure during the depositing, while maintaining the contact,
wherein an electric potential is applied to the CNT substrate, wherein the template structure has a lower electrical conductivity than the tip of the growing CNT substrate
wherein an electric field bias is applied to the growing CNT substrate, such that the field gradient and charge concentration are varied in the growing CNT substrate through choice of electrode geometry.

21. The method of claim 20, wherein the electric field bias promotes self-regulation of the CNT substrate growth rate by steps comprising
contacting the CNT substrate with an electrically insulating template structure;
applying an electrical potential to the CNT substrate at the point where the CNT is bonded to the inert support, wherein the counter-electrode is in a ring configuration surrounding the CNT substrate at a distance away from the point of surface electrical contact; and
adding carbon atoms to the CNT substrate as the CNT substrate is translated, such that the rate of carbon atom addition at the CNT substrate is proportional to the electric field gradient established at the tip of the CNT substrate.

* * * * *